United States Patent
Sano et al.

(10) Patent No.: US 6,322,220 B1
(45) Date of Patent: *Nov. 27, 2001

(54) EXPOSURE APPARATUS AND DEVICE MANUFACTURING METHOD USING THE SAME

(75) Inventors: Naoto Sano; Chidane Ouchi, both of Utsunomiya (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/991,442

(22) Filed: Dec. 16, 1997

Related U.S. Application Data (63) Continuation of application No. 08/388,409, filed on Feb. 14, 1995, now abandoned.

(30) Foreign Application Priority Data

| Feb. 14, 1994 | (JP) | 6-017361 |
| Feb. 14, 1994 | (JP) | 6-017362 |

(51) Int. Cl.⁷ .............. G02B 5/04; H01S 3/08; G03B 27/72
(52) U.S. Cl. ............ 359/615; 355/67; 355/71; 372/100; 372/101; 372/102; 372/103
(58) Field of Search .............. 355/53, 67, 71; 356/331, 332; 359/558, 566, 615; 372/23, 57, 100, 102, 101, 103

(56) References Cited

U.S. PATENT DOCUMENTS

| 3,907,430 | 9/1975 | Mann | 356/100 |
| 4,114,112 | 9/1978 | Epstein et al. | 372/23 |

(List continued on next page.)

FOREIGN PATENT DOCUMENTS

| 341078 | 1/1931 | (GB) | 359/615 |
| 61-59440 | 3/1986 | (JP) | 355/71 |
| 2-33914 | 2/1990 | (JP) | 355/71 |
| 3-223740 | 10/1991 | (JP) | 355/71 |
| 63-302519 | 12/1988 | (JP) | 372/57 |
| 64-77123 | 3/1989 | (JP) | 372/57 |
| 1-289113 | 11/1989 | (JP) | 372/57 |
| 4-211108 | 8/1992 | (JP) | 372/57 |

OTHER PUBLICATIONS

R. L. Sheffield, et al., "An Independently Controllable Multiline Laser Resonator and Its Use in Multifrequency Injection Locking," Appl. Phys. Lett., vol. 29, No. 9, Indv 1976, pp. 588–590.

*Primary Examiner*—Cassandra Spyrou
*Assistant Examiner*—John Juba, Jr.
(74) *Attorney, Agent, or Firm*—Fitzpatrick, Cella, Harper & Scinto (57) ABSTRACT

An exposure apparatus includes a first dispersing element for dispersing substantially parallel laser light, from a laser, with respect to the wavelength to provide light beams of wavelength units, a first optical system for collecting each light beam of a wavelength unit from the first dispersing element, a wavelength selecting device for passing a predetermined wavelength region of light, of the light beams of wavelength units each being collected by the first optical system, a second optical system for receiving the light from the wavelength selecting device and providing parallel light beams of wavelength units, and a second dispersing element for combining the parallel light beams of wavelength units from the second optical system, the second dispersing element having substantially the same angular dispersion as that of the first dispersing element and a direction of dispersion opposite to that of the first dispersing element.

5 Claims, 9 Drawing Sheets

U.S. PATENT DOCUMENTS

| | | | |
|---|---|---|---|
| 4,235,518 | 11/1980 | Greiner | 359/563 |
| 4,494,235 | 1/1985 | Guch, Jr. et al. | 372/23 |
| 4,660,975 | 4/1987 | Aughton | 356/308 |
| 4,853,756 | 8/1989 | Matsuki | 355/71 |
| 4,856,018 | 8/1989 | Nozue et al. | 372/98 |
| 4,961,001 * | 10/1990 | Liegel et al. | 250/491.1 |
| 4,963,003 | 10/1990 | Hiiro | 359/615 |
| 5,067,811 | 11/1991 | Ouchi | 356/121 |
| 5,121,160 | 6/1992 | Sano et al. | 355/53 |
| 5,250,797 | 10/1993 | Sano et al. | 250/205 |
| 5,263,039 | 11/1993 | Skupsky et al. | 372/25 |
| 5,317,450 | 5/1994 | Kamon | 359/566 |
| 5,404,366 | 4/1995 | Wakabayashi et al. | 372/29 |
| 5,414,540 | 5/1995 | Patel et al. | 359/39 |
| 5,661,547 * | 8/1997 | Aketagawa et al. | 355/53 |
| 5,831,715 * | 11/1998 | Takahashi | 355/53 |
| 5,838,426 * | 11/1998 | Shinonaga et al. | 355/71 |
| 6,101,211 * | 8/2000 | Wakabayashi et al. | 372/102 |

* cited by examiner

EXPOSURE APPARATUS AND DEVICE MANUFACTURING METHOD USING THE SAME

This application is a continuation of application No. 08/388,409, filed Feb. 14, 1995, now abandoned.

FIELD OF THE INVENTION AND RELATED ART

This invention relates to an exposure apparatus and a device manufacturing method. More particularly, the invention is concerned with an exposure apparatus and a device manufacturing method, suitably usable for the manufacture of devices such as ICs, LSIs, CCDs, liquid crystal panels or magnetic heads, for example.

With the increasing degree of integration of semiconductor devices, exposure apparatuses of high resolution and having a large exposure area are desired. As an apparatus which meets these requirements, a scan type reduction projection exposure apparatus for exposing a mask and a wafer while scanning them has attracted a great deal of attention.

On the other hand, on the point of reducing the resolvable line width, the use of shorter wavelength light as exposure light is desired. In this respect, the use of an excimer laser, for example, which emits intense light in the deep ultraviolet region, in a scan type reduction projection exposure apparatus, has been proposed.

However, as regards the emission spectrum of an excimer laser, in a case of a KrF excimer laser, it is about 0.3 nm in terms of half full width (FWHM). Thus, the band width is not sufficiently narrow.

This problem may be solved by using a band narrowing unit for narrowing the band width of the laser light. However, the use of a band narrowing unit raises another problem that the exposure apparatus has to be operated fixedly with exposure light of a narrow spectrum. Thus, the latitude of the exposure apparatus with respect to the exposure light is limited considerably.

SUMMARY OF THE INVENTION

It is an object of the present invention to provide an exposure apparatus having a large latitude with respect to exposure light.

In accordance with an aspect of the present invention, there is provided an exposure apparatus having means for changing the band width of laser light. Particularly, the apparatus is provided with dispersing means for dispersing laser light with respect to wavelength, an optical system for collecting each of laser lights of wavelength units being dispersed and wavelength selecting means for changing the band width of laser light to be provided thereby, by changing a blocking portion for intercepting the collected laser light. With this arrangement, the spectrum of exposure light is made variable, and thus, the latitude of the apparatus with respect to the exposure light is enlarged. This assures optimum exposure processes best suited to different types of wafer processes, respectively.

The dispersing element, the optical system and the wavelength selecting means may be provided within a resonator and, on that occasion, a decrease of intensity of the laser light is avoided irrespective of the provision of the band narrowing unit.

A Brewster window for transforming laser light into linearly polarized light as well as a reflector for turning the laser light back into a chamber may be provided within the resonator.

The dispersing element may comprise a prism or a diffraction grating. The laser may comprise an excimer laser.

One preferred form of the present invention comprises a first unit for making the spectral width of the laser light smaller than a natural emission spectrum, and a second unit for setting the spectral width of the laser light at the natural emission spectrum, the first and second units being able to be used alternately, such that a larger latitude with respect to exposure light is assured.

In one preferred form of the present invention, the wavelength selecting means may comprise a slit of a variable opening width.

In one preferred form of the present invention, the second unit for setting the spectral width of laser light at the natural emission spectrum may comprise a total reflection mirror which may be interposed between the chamber of the resonator and the pair of the dispersing means and the wavelength selecting means.

In accordance with this aspect of the present invention, there is provided a high-resolution scan type exposure apparatus for scanning a mask and a substrate with laser light from a wavelength selecting means to thereby project a pattern of the mask onto the substrate.

In accordance with another aspect of the present invention, there is provided an exposure apparatus which comprises a first dispersing element for dispersing substantially parallel laser light, from a laser, with respect to the wavelength to provide light beams in wavelength units, a first optical system for collecting each laser light beam of a wavelength unit from the first dispersing element, wavelength selecting means for passing a desired wavelength region of laser light, of the light beams of the wavelength units each being collected by the first optical system, a second optical system for receiving the laser light from the wavelength selecting means and providing parallel light beams of wavelength units, and a second dispersing element for combining the parallel laser light beams of the wavelength units from the second optical system, the second dispersing element having substantially the same angular dispersion as that of the first dispersing element, but having a direction of dispersion opposite to that of the first dispersing element. The dispersing elements may be disposed out of a resonator of the laser, to narrow the band width of the laser light, such that the emission strength of the laser light is stable.

Also, the provision of the second optical system and the second dispersing element is effective to avoid or reduce eccentricity of the wavelength distribution along the section of the laser light.

The wavelength selecting means may change the size of the region through which the laser light can pass, such that the supply of laser light having a desired band width best suited to wafer processes is allowed. For example, the wavelength selecting means may comprise slit means having a variable slit width.

Each of the first and second dispersing elements may comprise a prism or a diffraction grating. The laser may comprise an excimer laser.

In accordance with this aspect of the present invention, there is provided a high resolution scan type exposure apparatus for scanning a mask and a substrate with laser light from the second dispersing element by which a pattern of the mask is projected onto the substrate.

Also, in accordance with another aspect of the present invention, there is provided a device manufacturing method by which the manufacture of devices of a large area and a high integration is allowed.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
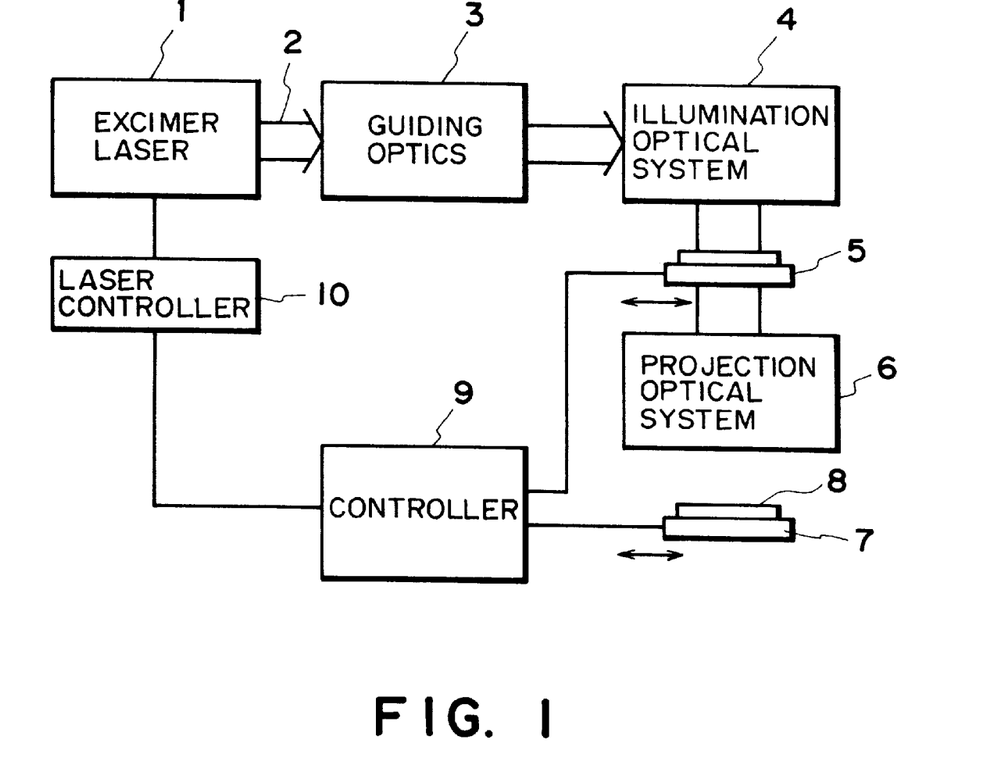
FIG. 1 is a schematic illustration of a first embodiment of the present invention.

FIG. 1 shows a first embodiment of the present invention, and illustrates a scan type reduction projection exposure apparatus for use in the manufacture of devices such as ICs, LSIs, CCDs, liquid crystal panels or magnetic heads, for example.

In FIG. 1, denoted at 1 is a KrF excimer laser which is a pulse laser light source for emitting pulsed laser light. This light source 1 emits light having a wavelength of about 248 nm in the deep ultraviolet region.

In FIG. 1, denoted at 2 is pulse light emitted by the light source 1, and denoted at 3 is a guiding optical system. Denoted at 4 is an illumination optical system, and denoted at 5 is a mask stage on which a mask having a device pattern to be transferred is placed. Denoted at 6 is a projection optical system for projecting the pattern of the mask onto a wafer 8. Denoted at 7 is a wafer stage on which a wafer 8 is placed. Denoted at 9 is a controller for controlling and setting conditions (process conditions) of exposure light to be projected to the wafer. Denoted at 10 is a laser controller for controlling the laser 1 in accordance with the conditions set by the controller 9. The mask stage 5 and the wafer stage 7 are scanned in the directions of the arrows, relative to the illumination optical system 4 and the projection optical system 6, by which the scan exposure of the wafer 8 is performed.

For the condition setting, an operator specifies the pulse energy of the pulse light 2 and the number of pulses, to be determined by the required resolution and the resist sensitivity, for example, and inputs the data into the controller 9. In accordance with the specified conditions, the controller 9 determines the optimum or necessary laser emission conditions which may include the energy of each laser pulse, the emission frequency and the spectral width, for example.

Figure 2:
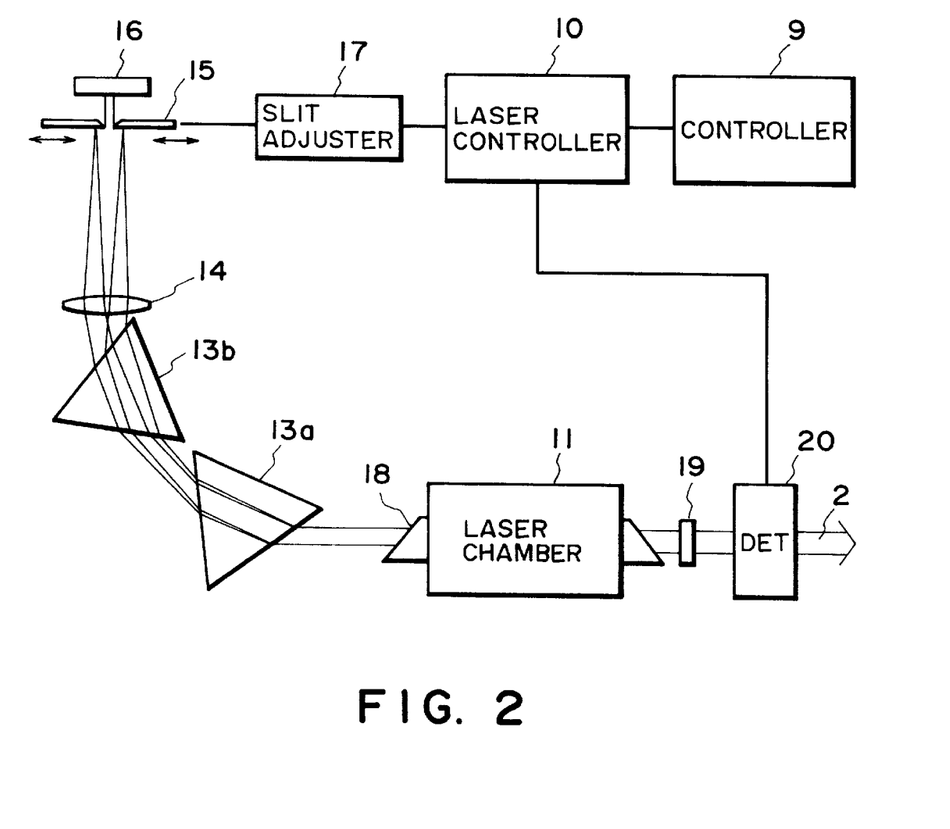
FIG. 2 is a schematic illustration of the structure of a laser 1 of FIG. 1.

FIG. 2 is a schematic view for explaining how to change the spectral width of the laser and the energy of each pulse in accordance with the determined emission conditions, and it shows details of the structure of the laser 1.

In FIG. 2, denoted at 11 is a laser chamber for the laser 1, and denoted at 2 is pulsed laser light. Denoted at 13a and 13b are prisms as dispersing elements, and denoted at 14 is a convex lens. Denoted at 15 is a variable slit having a variable width opening, being disposed at a focal point position of the convex lens 14. Denoted at 16 is a total reflection mirror disposed in close proximity to the variable slit 15, and denoted at 17 is a slit width adjusting device for actuating the variable slit 15 to change the width of the opening thereof. Denoted at 18 is a Brewster window for establishing a predetermined state of polarization in the laser light, and denoted at 19 is an output mirror for extracting a portion of the laser light out of the resonator. Denoted at 20 is a photodetector for detecting the energy (output) of the laser light to be directed to the guiding optical system 3.

In the exposure apparatus of this embodiment, the following adjustment may be done to obtain pulse laser light 2 having a spectral width of about 0.1 nm, for example:

When a KrF excimer laser is used, the laser chamber 11 emits laser light having a basic emission band width of about 0.3 nm. The laser light emitted by the laser chamber 11 is dispersed with respect to the wavelength by the prisms 13a and 13b.

The angular dispersion at respective surfaces of the prisms 13a and 13b is given by the following equation:

$$d\theta/d\lambda = (d\theta/dn)(dn/d\lambda)$$

where $\lambda$ is the wavelength of the laser light, $\theta$ is the incidence angle and n is the refractive index of the prism 13a or 13b with respect to the light having a wavelength $\lambda$.

If the prisms 13a and 13b are made of a glass material of synthetic quartz, the excimer laser comprises a KrF excimer laser, and the top or apex angle of the prism is 82 deg., and if the prisms are used with the smallest deflection angle, then:

$$\lambda = 248 \text{ nm}$$

$$n = 1.5084$$

$$dn/d\lambda = -5.6 \times 10^{-4}/\text{nm}$$

$$d\theta/dn = (1/n)\tan\theta = 4.56 \text{ rad}$$

Thus, $$d\theta/d\lambda = -2.55 \text{ mrad/nm}$$

When two prisms are used for the dispersion as in the present embodiment, there are four refracting surfaces. Thus, if the focal length of the convex lens 14 is denoted by f and the width of the opening of the slit 15 is denoted by L, then the band width $\Delta\lambda$ passing through the slit 15 is:

$$\Delta\lambda = L \cdot (f \cdot 4 d\theta/d\lambda)$$

Therefore, the width L of the opening of the slit 15 may be set as follows to obtain light having a band width $\Delta\lambda$:

$$L = f \cdot 4 d\theta/d\lambda \cdot \Delta\lambda$$

For example, if the focal length of the convex lens is f=100 mm, then, in order to obtain a band width of 0.1 nm of the laser light after passing the slit 15, the width L of the opening of the slit 15 may be adjusted by the slit width adjusting device 17 to be about 0.10 mm.

On the other hand, if a band width of about 0.3 nm of the laser light passing the slit 15 is desired, the slit width adjusting device 17 may be used to provide the opening width L of the slit 15 of not smaller than 0.30 mm.

The energy of each pulse of the laser light 2 can be changed by changing the width of the opening of the slit 15. As an example, if a spectral width of about 0.3 nm is desired and if a laser chamber 11, which supplies an emission energy of 20 mJ per each pulse, is used, the pulse energy can be changed within a range of about 10 to 20 mJ by changing the slit width.

Therefore, if a higher resolution is required, the width of the opening of the slit 15 may be narrowed to provide a narrower spectral width of about 0.1 nm, for example. If, on the other hand, a higher throughput is desired and a larger output of the laser 1 is desired, the width of the opening of the slit 15 may be enlarged to provide a broader spectral band width of about 0.3 nm. In this adjustment, the photodetector 20 may be used to control the laser output to a desired level.

The center wavelength if the band width is narrowed depends on the central position of the slit 15. In consideration thereof, a wavelength detector may preferably be provided within (or out of) the photodetector 20 so as to allow that the position and width of the slit may be adjusted while monitoring the wavelength of the pulse laser light. Also, if it is desired to make stable the center wavelength of the pulse laser light, the output of the wavelength detector may be used to control the slit 15.

In the exposure apparatus of this embodiment, there are provided dispersing means (e.g., a prism) for dispersing the laser light with respect to its wavelength, and a lens for collecting or converging each laser light beam of a wavelength unit being dispersed, as well as wavelength selecting means (variable slit) for changing the band width of the laser light to be provided thereby, by changing the portion for blocking the collected laser light, and they are disposed within a resonator. However, these components may be disposed outside the resonator.

Figure 3:
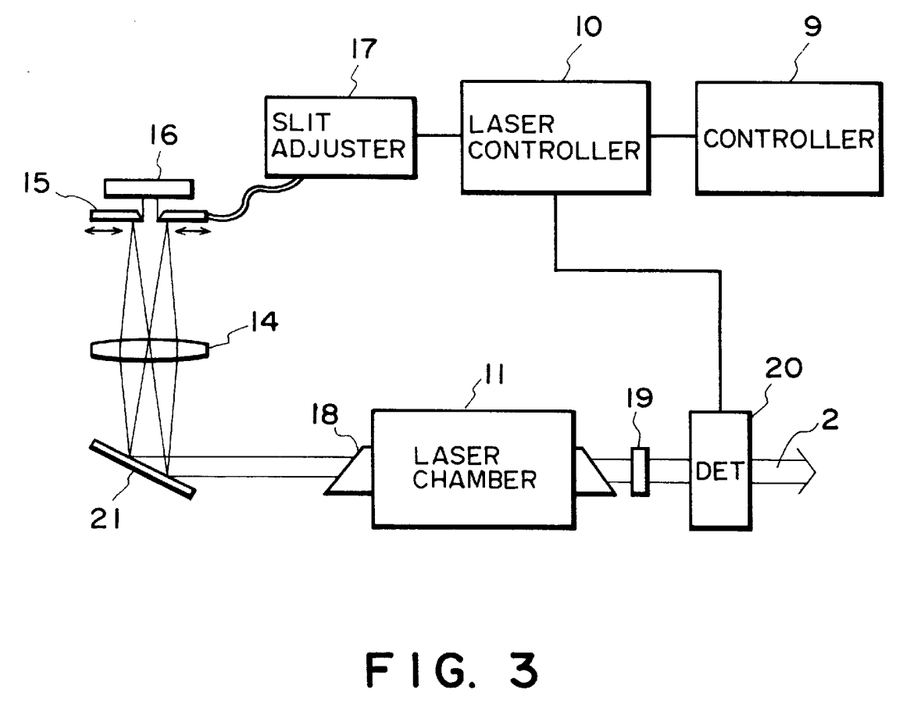
FIG. 3 is a schematic illustration of a modified form of the structure of the laser 1 of FIG. 1.

FIG. 3 illustrates another example of changing the spectral width of the laser 1 and the energy of each pulse in accordance with the determined emission conditions, and it shows details of the structure of the laser 1.

In FIG. 3, denoted at 11 is a laser chamber for the laser 1, and denoted at 2 is pulsed laser light emitted from the laser 1. Denoted at 21 is a grating (diffraction grating) as a dispersing element, and denoted at 14 is a convex lens. Denoted at 15 is a variable slit having a variable width opening, being disposed at a focal point position of the convex lens 14. Denoted at 16 is a total reflection mirror disposed in close proximity to the variable slit 15, and denoted at 17 is a slit width adjusting device for actuating the variable slit 15 to change the width of the opening thereof. Denoted at 18 is a Brewster window for establishing a predetermined state of polarization in the laser light, and denoted at 19 is an output mirror for extracting a portion of the laser light out of the resonator. Denoted at 20 is a photodetector for detecting the energy (output) of the laser light to be directed to the guiding optical system 3.

Also, in this embodiment, if the focal length of the convex lens is f=100 mm, then, in order to obtain a band width of 0.1 nm of the laser light after passing the slit 15, the width L of the opening of the slit 15 may be adjusted by the slit width adjusting device 17 to be about 0.10 mm.

On the other hand, if a band width of about 0.3 nm of the laser light passing the slit 15 is desired, the slit width adjusting device 17 may be used to provide the opening width L of the slit 15 of not smaller than 0.30 mm.

The energy of each pulse of the laser light 2 can be changed by changing the width of the opening of the slit 15. As an example, if a spectral width of about 0.3 nm is desired and if a laser chamber 11 which supplies an emission energy of 20 mJ per each pulse is used, the pulse energy can be changed within a range of about 10 to 20 mJ by changing the slit width.

Therefore, if a higher resolution is required, the width of the opening of the slit 15 may be narrowed to provide a narrower spectral width of about 0.1 nm, for example. If, on the other hand, a higher throughput is desired and a larger output of the laser 1 is desired, the width of the opening of the slit 15 may be enlarged to provide a broader spectral band width of about 0.3 nm. In this adjustment, the photodetector 20 may be used to control the laser output to a desired level.

The center wavelength if the band width is narrowed depends on the central position of the slit 15. In consideration thereof, a wavelength detector may preferably be provided within (or out of) the photodetector 20 so as to allow that the position and width of the slit may be adjusted while monitoring the wavelength of the pulse laser light. Also, if it is desired to make stable the center wavelength of the pulse laser light, the output of the wavelength detector may be used to control the slit 15.

In the exposure apparatus of this embodiment, there are provided dispersing means (e.g., a grating) for dispersing the laser light with respect to the wavelength and a lens for collecting or converging each laser light beam of a wavelength unit being dispersed, as well as wavelength selecting means (e.g., a variable slit) for changing the band width of laser light to be provided thereby, by changing the portion for blocking the collected laser light, and they are provided within a resonator. However, these components may be disposed outside the resonator.

Figure 4:
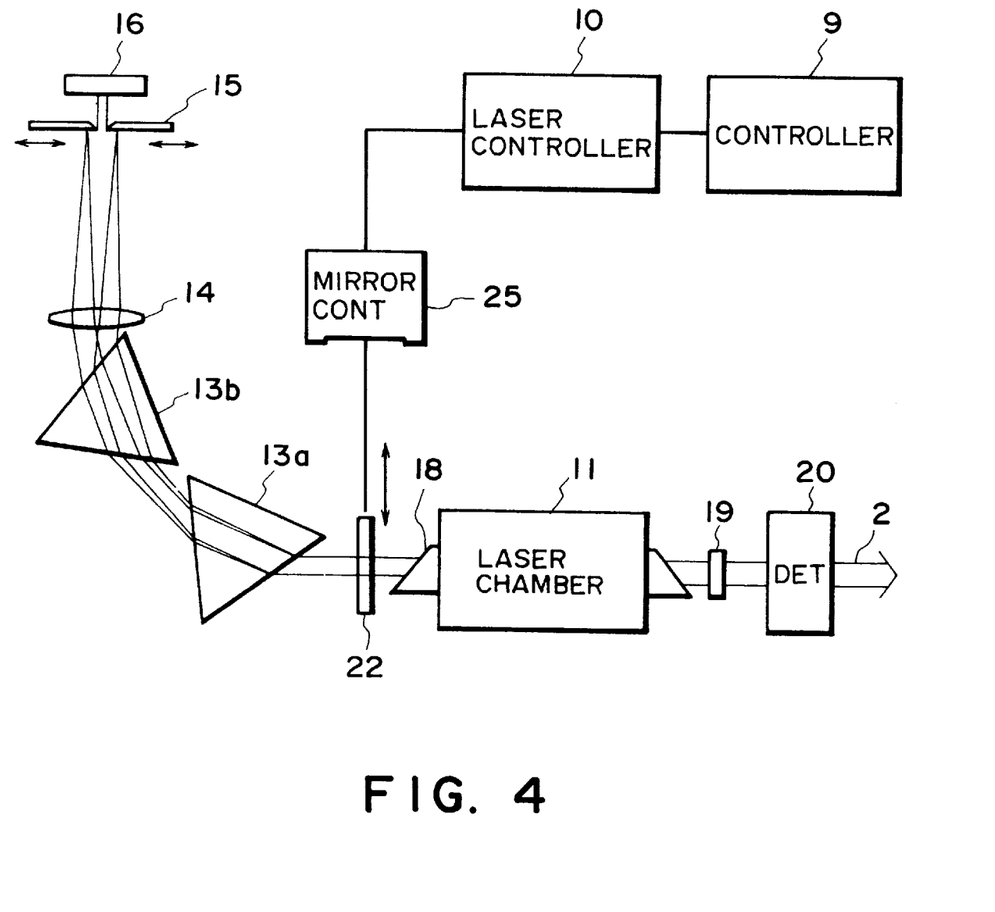
FIG. 4 is a schematic illustration of another modified form of the structure of the laser 1 of FIG. 1.

FIG. 4 illustrates a further example of changing the spectral width of the laser 1 and the energy of each pulse in accordance with the determined emission conditions, and it shows details of the structure of the laser 1.

In FIG. 4, denoted at 11 is a laser chamber for the laser 1, and denoted at 2 is pulsed laser light. Denoted at 13a and 13b are prisms as dispersing elements, and denoted at 14 is a convex lens. Denoted at 15 is a variable slit having a variable width opening, being disposed at a focal point position of the convex lens 14. Denoted at 16 is a total reflection mirror disposed in close proximity to the variable slit 15, and denoted at 17 is a slit width adjusting device for actuating the variable slit 15 to change the width of the opening thereof. Denoted at 18 is a Brewster window for establishing a predetermined state of polarization in the laser light, and denoted at 19 is an output mirror for extracting a portion of the laser light out of the resonator. Denoted at 20 is a photodetector for detecting the energy (output) of the laser light to be directed to the guiding optical system 3. Denoted at 22 is a total reflection mirror which cooperates with the output mirror 19 to provide a natural emission (non-band narrowing) laser resonator. Denoted at 25 is a total reflection mirror drive controller for moving the total reflection mirror 22 out of and back into the light path.

In this embodiment, in order to narrow the band width of the laser light to be less than 0.3 nm, the mirror drive controller 25 may be used to move the total reflection mirror 21 out of the light path. On the other hand, to provide a band width of about 0.3 nm, the mirror drive controller 25 may be used to move the total reflection mirror 21 into the light path. In this manner, the resonator means can be interchanged between a first unit with which the spectral width of the laser light can be made smaller than that of the natural emission spectrum and a second unit with which the spectral width of the laser light can be set at the natural emission spectrum. This assures an optimum laser emission condition adjusted to and best suited to a process condition.

Figure 5:
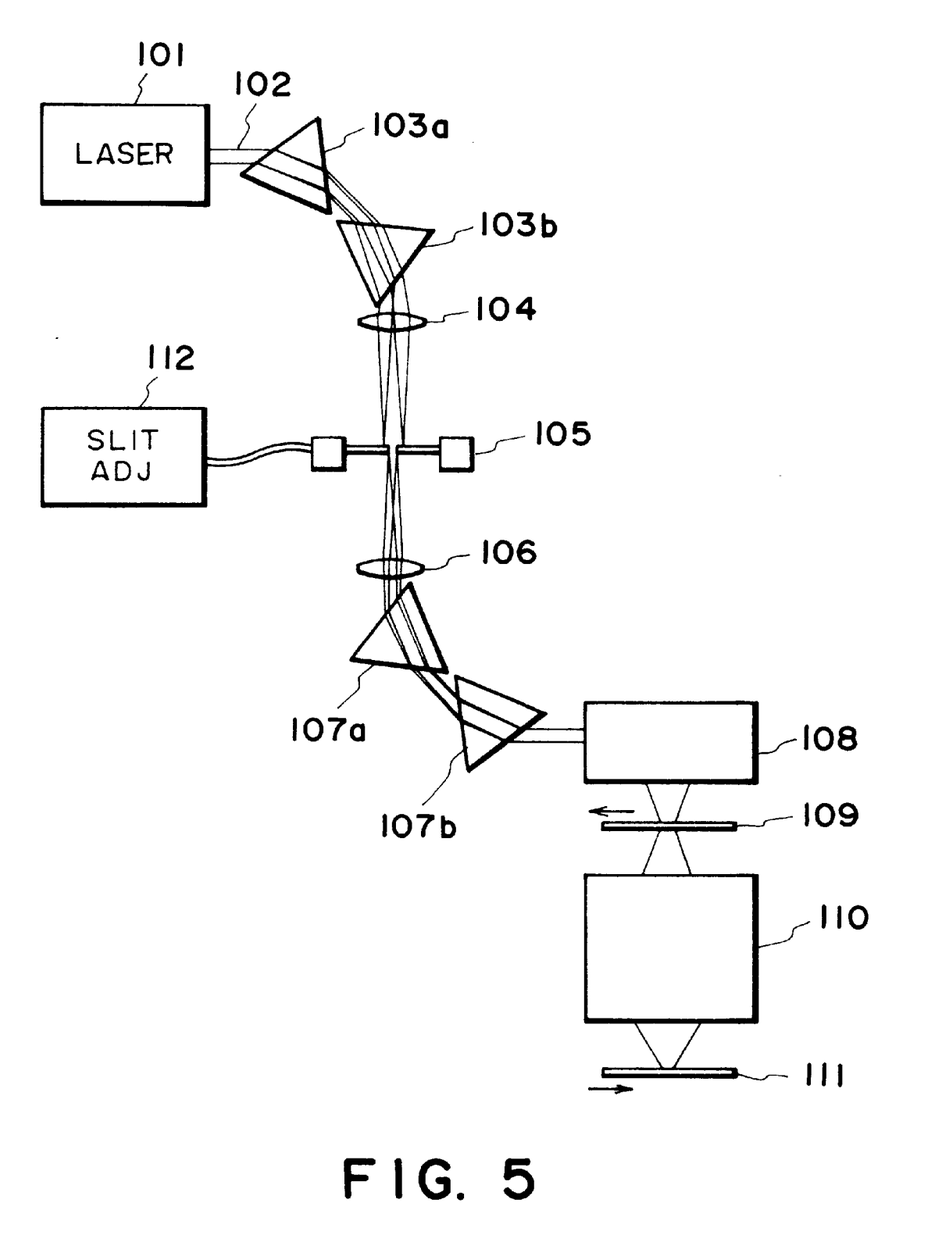
FIG. 5 is a schematic illustration of a second embodiment of the present invention.

FIG. 5 shows another embodiment of the present invention, and illustrates a scan type reduction projection exposure apparatus for use in the manufacture of devices such as ICs, LSIs, CCDs, liquid crystal panels or magnetic heads, for example.

In FIG. 5, denoted at 101 is a laser (light source). Denoted at 102 is laser light emitted by the laser 1, and it is substantially parallel light. Denoted at 103a and 103b are prisms (dispersing elements) for dispersing the laser light with respect to the wavelength. Denoted at 104 is a first convex lens for collecting or converging each of the laser light beams of wavelength units, being dispersed by the prisms 103a and 103b. Denoted at 105 is a variable slit having a variable width region (opening) for passing light. It is disposed at the focal point position of the first convex lens 104. Denoted at 106 is a second convex lens disposed separately from the variable slit 105, at a distance corresponding to the focal length thereof. Denoted at 107a and 107b are prisms having the same angular dispersion as that of the prism 103a or 103b. Denoted at 108 is an illumination optical system, and denoted at 109 is a mask having a device pattern to be transferred to a wafer. Denoted at 110 is a projection optical system for projecting the pattern of the mask onto the wafer. Denoted at 111 is a wafer onto which the device pattern of the mask 109 is to be transferred. Denoted at 112 is a slit width adjusting device for actuating the variable slit 105 to change the width of the opening thereof. The mask 109 and the wafer 111 are scanned in the directions of the arrows, relative to the laser light and the optical system 110.

In the exposure apparatus of this embodiment, the width of the opening of the variable slit 105 is adjusted to supply only laser light having a band width of 0.1 nm to the illumination optical system 108, and the dispersing means is provided outside the resonator of the laser 101 to narrow the band width of the laser light 2. Thus, the emission strength of the laser light 2 is quite stable.

If a KrF excimer laser is used as the laser 101, the laser 101 emits laser light 102 having a band width of 0.3 nm. This laser light 102 is dispersed by the dispersing means of the prisms 103a and 103b and, by means of the convex lens, each laser light beam of the same wavelength is collected or converged onto the variable slit 105.

The angular dispersion at respective surfaces of the prisms 103a and 103b is given by the following equation:

$$d\theta/d\lambda = (d\theta/dn)(dn/d\lambda)$$

where $\lambda$ is the wavelength of the laser light 102, $\theta$ is the incidence angle and n is the refractive index of the prism 103a or 103b with respect to light having a wavelength $\lambda$.

If the prisms are made of a glass material of synthetic quartz, the excimer laser 101 comprises a KrF excimer laser, and the top or apex angle of the prism is 82 deg., and if the prisms are used with the smallest deflection angle, then:

$$\lambda = 248 \text{ nm}$$

$$n = 1.5084$$

$$dn/d\lambda = -5.6 \times 10^{-4}/\text{nm}$$

$$d\theta/dn = (1/n)\tan\theta = 4.56 \text{ rad}$$

Thus, $$d\theta/d\lambda = -2.55 \text{ mrad/nm}$$

When two prisms are used for the dispersion as in the present embodiment, there are four refracting surfaces. Thus, if the focal length of the convex lens 104 is denoted by f and the width of the opening of the slit 105 is denoted by L, then the band width $\Delta\lambda$ passing through the slit 105 is:

$$\Delta\lambda = L \cdot (f \cdot 4d\theta/d\lambda)$$

Therefore, the width L of the opening of the slit 105 may be set as follows to obtain light having a band width $\Delta\lambda$:

$$L = f \cdot 4d\theta/d\lambda \cdot \Delta\lambda \tag{2}$$

For example, if f=100 mm, then, in order to obtain a band width of 0.1 nm of the laser light after passing the slit 105, the width L may be set to be equal to 0.10 mm.

On the other hand, if a band width of about 0.3 nm of the laser light passing the slit 105 is desired, the slit width adjusting device 112 may be used to provide the opening width L of the slit 105 of not smaller than 0.30 mm.

The strength of the laser light 102 directed to the illumination optical system 108 can be changed by changing the width of the opening of the slit 105. Therefore, if a higher resolution is required, the width of the opening of the slit may be narrowed to provide a narrower spectral width of about 0.1 nm, for example. If, on the other hand, a higher throughput is desired and a supply of stronger light to the illumination optical system 108 is desired, the opening of the slit may be enlarged.

The laser light 102 after passing the slit 105 has an eccentricity of wavelength in dependence upon the advancement direction. However, this eccentricity of wavelength is canceled in the exposure apparatus of the present embodiment by transforming the laser light back to parallel light by means of the convex lens 106 and the prisms 107a and 107b, of the same shapes as the convex lens 104 and the prisms 103a and 103b and disposed symmetrically with respect to the slit 105 and by simultaneously applying dispersion opposite to the dispersion applied by the prisms 103a and 103b. Thus, the eccentricity canceled laser light is supplied to the illumination optical system 108.

The laser light 102 is then shaped by the illumination optical system 108 to have a predetermined N.A. (numerical aperture) and a predetermined illuminance distribution, and subsequently, it is projected on the mask 109. After passing the mask 109, it goes through the projection optical system 110, which is provided to project the device pattern of the mask 109 onto the wafer 111 in a reduced scale, such that the wafer 111 is exposed with the projected light.

In order to change wave band width $\Delta\lambda$ of the exposure light, the slit width adjusting device 112 is actuated to adjust the slit width L of the variable slit 105 in accordance with equation (1).

Figure 6:
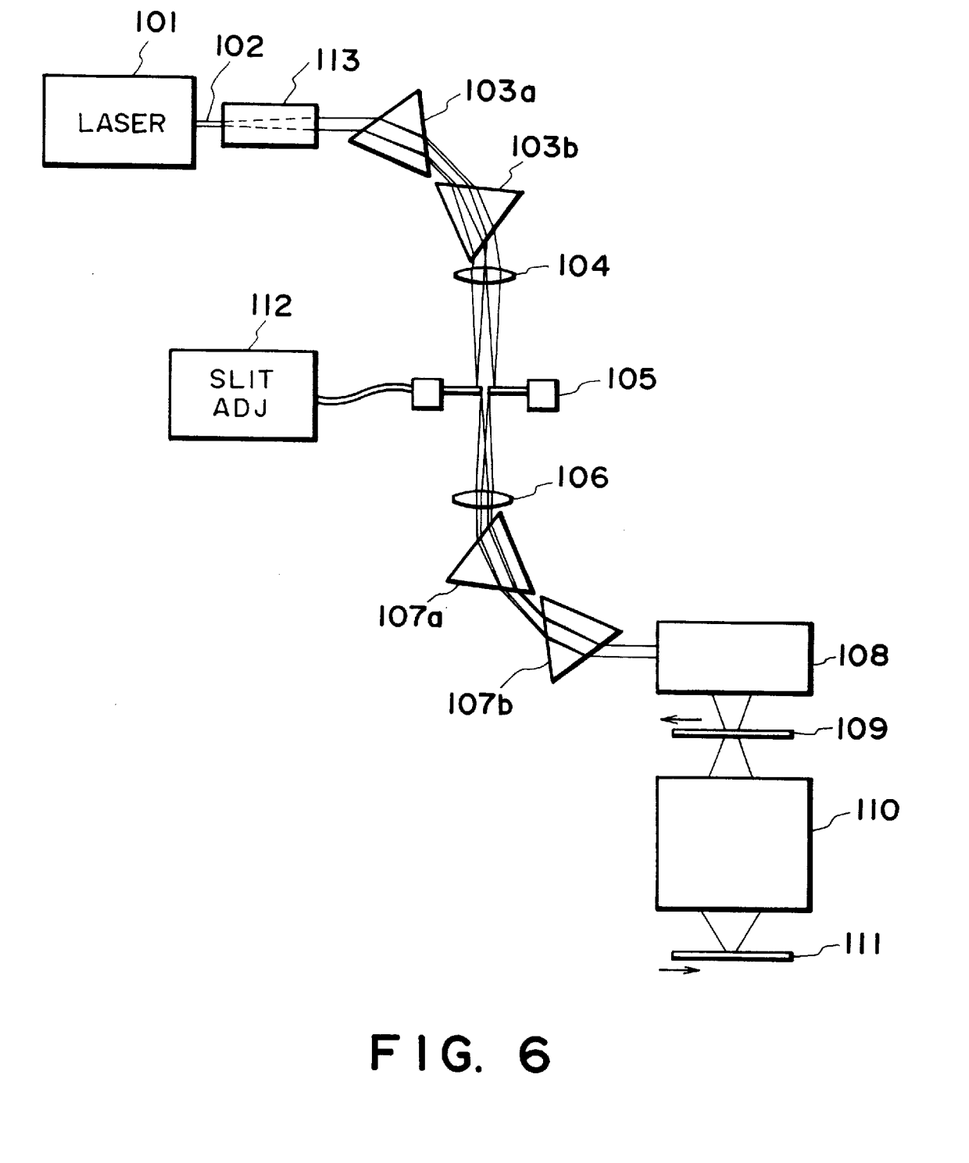
FIG. 6 is a schematic illustration of a third embodiment of the present invention.

FIG. 6 is a schematic view of a further embodiment of the present invention, and it shows a scan type reduction projection exposure apparatus for use in the manufacture of devices such as ICs, LSIs, CCDs, liquid crystal panels or magnetic heads, for example. In FIG. 6, the same reference numerals as these of FIG. 5 are assigned to corresponding elements.

The exposure apparatus of FIG. 6 is distinguished from the exposure apparatus of FIG. 5 in the provision of a member 113. This member 113 is used when, upon dispersing the laser light by a prism to produce light of a desired band width Δλ, the diversion angle of the laser light 2 is so large as cannot be disregarded.

The element 113 comprises a beam expander which serves to expand the laser light 2, emitted by the laser 1, and which also serves to reduce the diversion angle. By means of this beam expander 113, the expansion rate of the laser beam diameter is changed in accordance with the dispersion angle Δθ by the prism and the diversion angle of the laser light 102. By this, exposure light having a band width Δλ is correctly produced.

Figure 7:
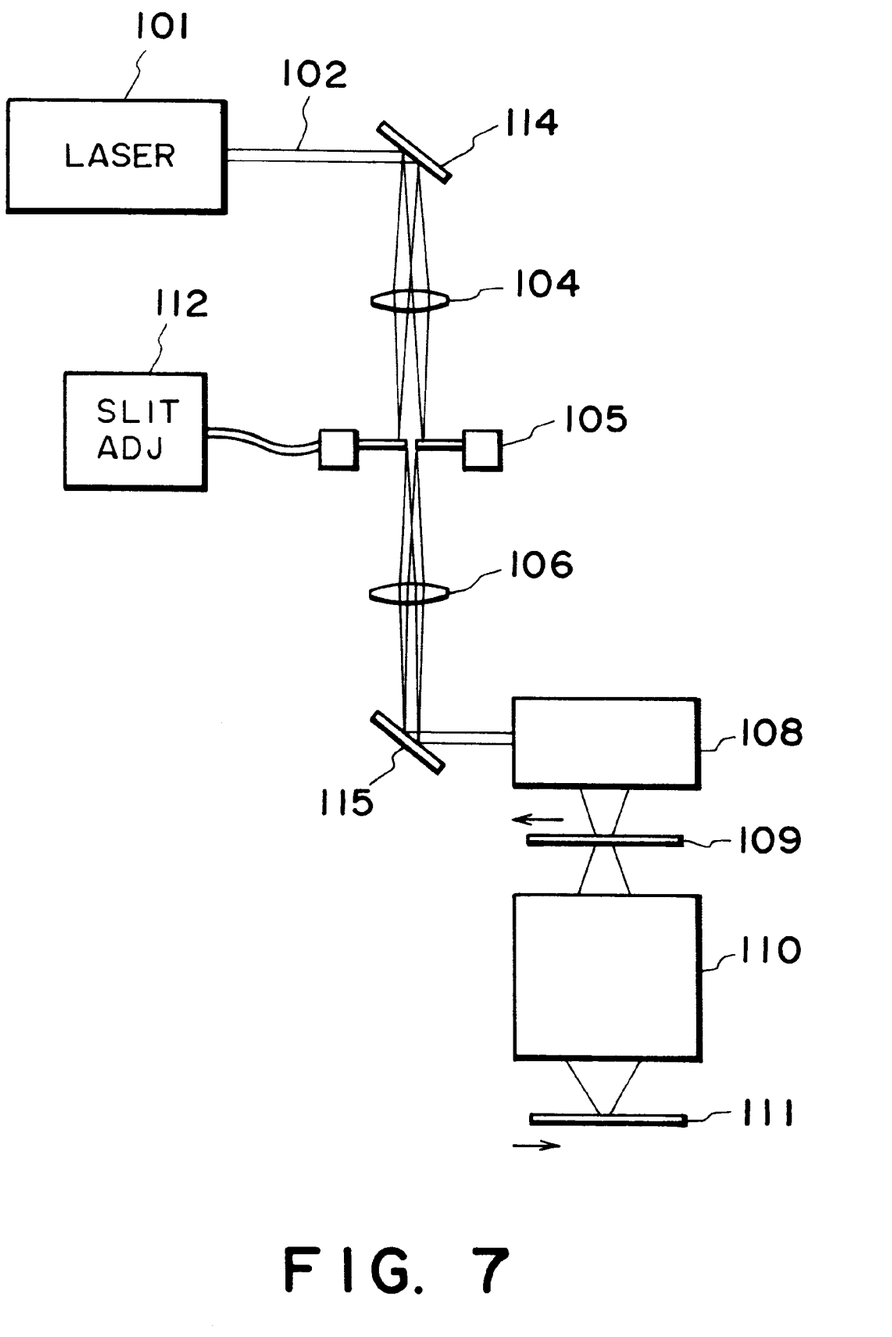
FIG. 7 is a schematic illustration of a fourth embodiment of the present invention.

FIG. 7 is a schematic view of a further embodiment of the present invention, and it shows a scan type reduction projection exposure apparatus for use in the manufacture of devices such as ICs, LSIs, CCDs, liquid crystal panels or magnetic heads, for example. In FIG. 7, the same reference numerals as those of FIG. 5 are assigned to corresponding elements.

The exposure apparatus of FIG. 7 is distinguished from the exposure apparatus of FIG. 5 in the use of gratings (diffraction gratings) in place of prisms, as the dispersing means. In FIG. 7, denoted at 113 and 114 are gratings which serve as dispersing elements. The grating 113 is provided in place of the prisms 3a and 3b of FIG. 1, and the grating 114 is provided in place of the prisms 7a and 7b of FIG. 1. Generally, a grating has a larger angular dispersion as compared with a prism, and the exposure apparatus of FIG. 7 has an advantage in a case when a narrower band width exposure light is desired.

Next, an embodiment of a device manufacturing method, which uses one of the exposure apparatuses of FIGS. 1–7, will now be explained.

Figure 8:
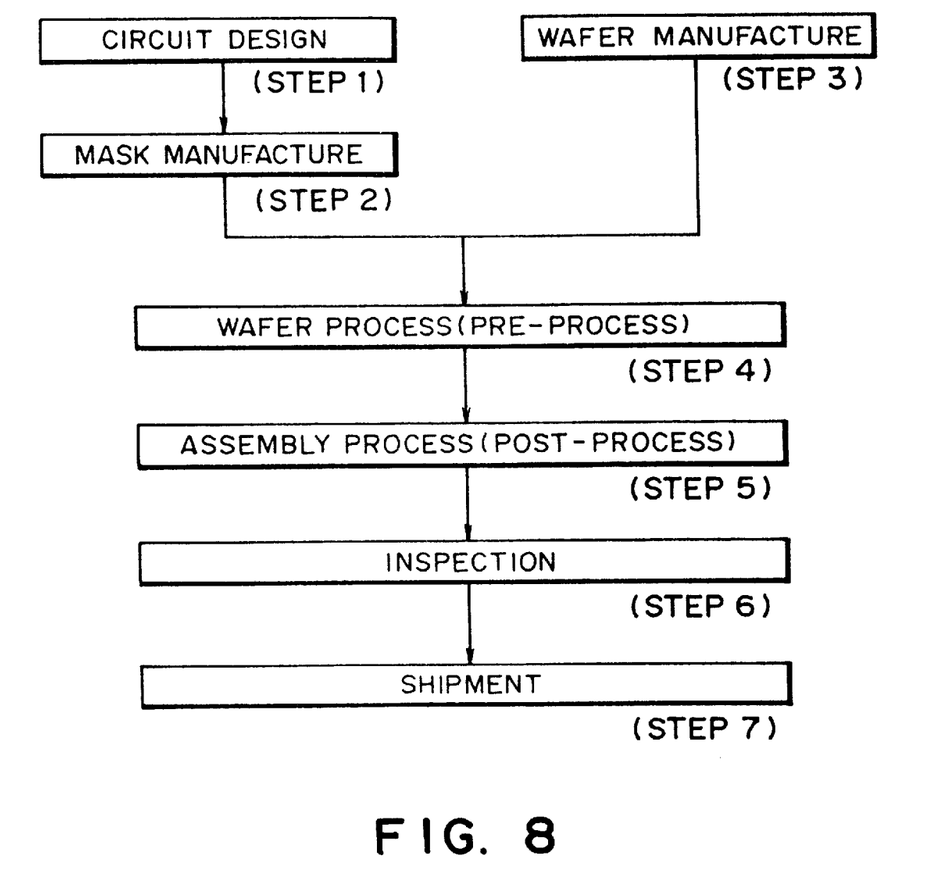
FIG. 8 is a flow chart of device manufacturing processes.

FIG. 8 is a flow chart of the sequence of manufacturing a semiconductor device such as a semiconductor chip (e.g., an IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process, which is called a pre-process, wherein, by using the so prepared mask and wafer, circuits are practically formed on the wafer through lithography. Step 5 subsequent to this is an assembling step, which is called a post-process, wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 9:
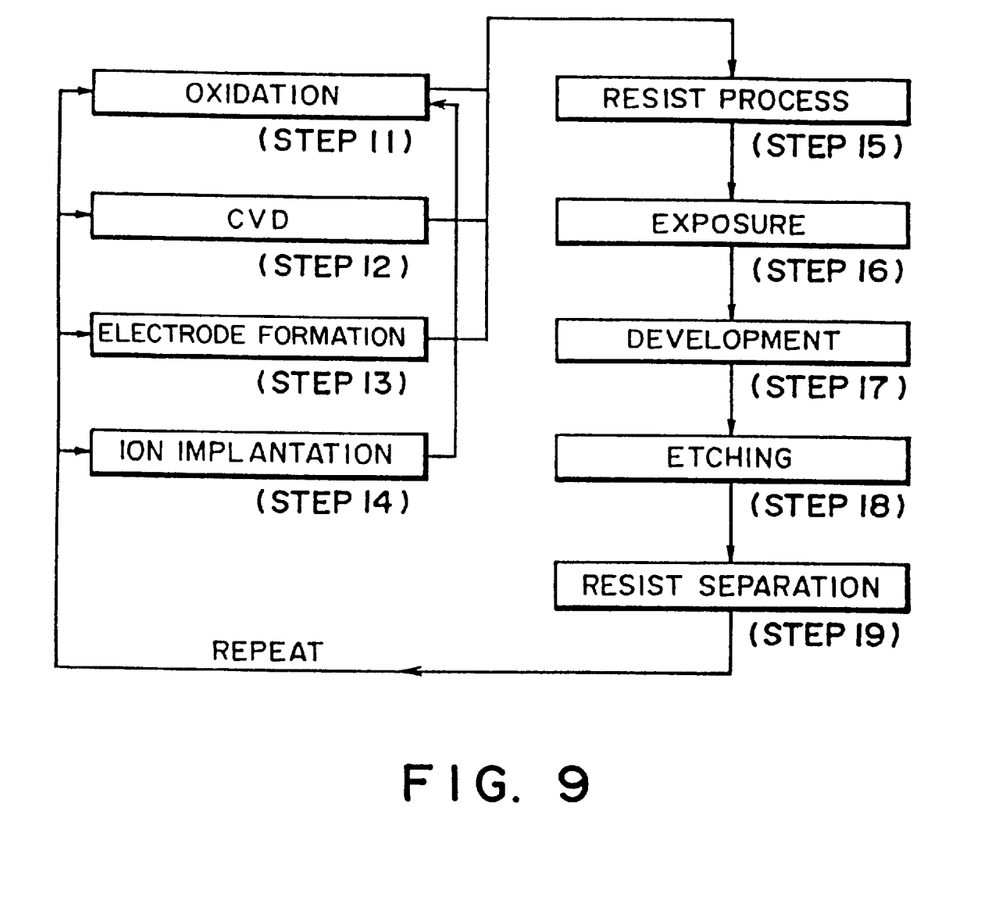
FIG. 9 is a flow chart of a wafer process.

FIG. 9 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask onto the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a substrate with a pattern of a mask by use of light from a laser, said apparatus comprising:

dispersing means for dividing light into beams having different wavelengths and directing the light beams in different directions;

focusing means for focusing the beams having the different wavelengths, from said dispersing means, upon a predetermined plane, said focusing means causing the beams to be incident on the predetermined plane at different positions; and wavelength selecting means for selecting light beams of particular wavelengths from among the beams having different wavelengths focused on the plane, said wavelength selecting means including a pair of movable light blocking plates operable to define a slit through which the light beams of the particular wavelengths pass, wherein said wavelength selecting means changes the positions of said movable light blocking plates so that a bandwidth of the light beams of the particular wavelengths varies while a central wavelength of the light beams of the particular wavelengths is maintained, wherein said laser has a predetermined mirror at an end of a resonator thereof, and an output mirror at another end of said resonator, wherein said wavelength selecting means, said focusing means and said dispersion means are disposed between said predetermined mirror and said output mirror, in this order from said predetermined mirror.

2. An apparatus according to claim 1, wherein the light is laser light and wherein said apparatus further comprises a Brewster window for transforming the laser light into a linearly polarized light and a reflector for directing the laser light back into a chamber, both being provided in said resonator.

3. A device manufacturing method comprising:

providing an exposure apparatus as recited in any one of claims 1 or 2;

supplying a mask, having a circuit pattern into the exposure apparatus;

supplying a substrate, coated with a resist, into the exposure apparatus; and transferring the circuit pattern of the mask onto the resist of the substrate by using the exposure apparatus.

4. A laser apparatus for exposing a substrate, said apparatus comprising:

dispersing means for dividing laser light into beams having different wavelengths and directing the light beams in different directions;

focusing means for focusing the beams having the different wavelengths, from said dispersing means, upon a predetermined plane, said focusing means causing the beams to be incident on the predetermined plane at different positions; and wavelength selecting means for selecting light beams of particular wavelengths from among the beams having different wavelengths focused on the plane, said wavelength selecting means including a pair of movable light blocking plates operable to define a slit through which the light beams of the particular wavelengths pass, wherein said wavelength selecting means changes the positions of said movable light blocking plates so that a bandwidth of the light beams of the particular wavelengths varies while a central wavelength of the light beams of the particular wavelengths is maintained, wherein said laser has a predetermined mirror at an end of a resonator thereof, and an output mirror at another end of said resonator, wherein said wavelength selecting means, said focusing means and said dispersion means are disposed between said predetermined mirror and said output mirror, in this order from said predetermined mirror.

5. An apparatus according to claim 4, further comprising a Brewster window for transforming the laser light into a linearly polarized light and a reflector for directing the laser light back into a chamber, both being provided in said resonator.

* * * * *

UNITED STATES PATENT AND TRADEMARK OFFICE
CERTIFICATE OF CORRECTION

PATENT NO.    : 6,322,220 B1
DATED         : November 27, 2001
INVENTOR(S)   : Naoto Sano et al.

It is certified that error appears in the above-identified patent and that said Letters Patent is hereby corrected as shown below:

Column 4,
Line 43, "-5.6×10-4/nm" should read -- $-5.6 \times 10^{-4}$ 1/nm --.
Line 65, "passing" should read -- passing through --.

Column 5,
Line 2, "passing" should read -- passing through --.
Line 61, "passing" should read -- passing through --.
Line 65, "passing" should read -- passing through --.

Column 7,
Line 65, "-5.6×10-4/nm" should read -- $-5.6 \times 10^{-4}$ 1/nm --.

Column 8,
Line 35, "in dependence" should read -- dependent --.
Line 54, "wave" should read -- the --.
Line 63, "these" should read -- those --.

Column 9,
Line 3, "as" should read -- that it --.

Signed and Sealed this

Twenty-third Day of July, 2002

*Attest:*

JAMES E. ROGAN
*Attesting Officer*  *Director of the United States Patent and Trademark Office*